(12) United States Patent
Trezza (10) Patent No.: US 8,860,083 B1
(45) Date of Patent: Oct. 14, 2014

(54) LOW NOISE HYBRIDIZED DETECTOR USING CHARGE TRANSFER

(71) Applicant: Sensors Unlimited, Inc., West Trenton, NJ (US)

(72) Inventor: John Alfred Trezza, Manalapan, NJ (US)

(73) Assignee: Sensors Unlimited, Inc., West Trenton, NJ (US)

( * ) Notice: Subject to any disclaimer, the term of this patent is extended or adjusted under 35 U.S.C. 154(b) by 0 days.

(21) Appl. No.: 13/892,737

(22) Filed: May 13, 2013

(51) Int. Cl.
| | | |
|---|---|---|
| H01L 31/101 | (2006.01) | |
| H01L 31/112 | (2006.01) | |
| H01L 31/11 | (2006.01) | |
| H01L 31/18 | (2006.01) | |
| H01L 33/00 | (2010.01) | |
| H01L 31/105 | (2006.01) | |
| H01L 27/146 | (2006.01) | |
| H01L 31/107 | (2006.01) | |

(52) U.S. Cl.
CPC ......... H01L 31/1129 (2013.01); H01L 33/0016 (2013.01); H01L 31/105 (2013.01); H01L 27/14649 (2013.01); H01L 31/1123 (2013.01); H01L 31/1105 (2013.01); H01L 31/1844 (2013.01); H01L 31/1075 (2013.01)
USPC ........ 257/187; 257/258; 257/188; 257/183.1; 257/288; 250/208.1; 327/502

(58) Field of Classification Search
CPC .............. H01L 31/105; H01L 31/1844; H01L 31/1075; H01L 33/0016; H01L 33/08; H01L 27/14649; H01L 2924/10329; H01L 21/02381; H01L 21/02463; H01L 21/02546; H01L 21/3245; H01L 21/82
USPC ................................. 257/180–200
See application file for complete search history.

(56) References Cited

U.S. PATENT DOCUMENTS

| | | | |
|---|---|---|---|
| 5,386,128 A * | 1/1995 | Fossum et al. | ............. 257/183.1 |
| 6,005,266 A | 12/1999 | Forrest et al. | |
| 6,573,581 B1 | 6/2003 | Sugg et al. | |
| 2007/0018075 A1 * | 1/2007 | Cazaux et al. | ............. 250/208.1 |
| 2008/0111165 A1 * | 5/2008 | Kao | ............................. 257/288 |
| 2010/0230720 A1 | 9/2010 | Wicks | |
| 2010/0271108 A1 * | 10/2010 | Sanfilippo et al. | ............ 327/502 |

OTHER PUBLICATIONS

"A 128x128 InGaAs Detector Array for 1.0-1.7 Microns" G.Olsen, et. al., SPIE vol. 1341 Infrared Technology XVI (1990), pp. 432-437.*

* cited by examiner

*Primary Examiner* — Marcos D. Pizarro
*Assistant Examiner* — Nelson Garces
(74) *Attorney, Agent, or Firm* — Kinney & Lange, P.A.

(57) ABSTRACT

A low noise infrared photodetector has an epitaxial heterostructure that includes a photodiode and a transistor. The photodiode includes a high sensitivity narrow bandgap photodetector layer of first conductivity type, and a collection well of second conductivity type in contact with the photodetector layer. The transistor includes the collection well, a transfer well of second conductivity type that is spaced from the collection well and the photodetector layer, and a region of first conductivity type between the collection and transfer wells.

16 Claims, 8 Drawing Sheets

LOW NOISE HYBRIDIZED DETECTOR USING CHARGE TRANSFER

BACKGROUND

This invention generally relates to a device for detecting radiation in the near infrared (IR) spectrum. In particular, the invention relates to a low noise IR detector that operates by transferring charge rather than by charging and resetting a capacitor through which voltage is read.

Modern infrared (IR) imaging systems can be focal plane arrays of detectors and associated integrated circuitry in each pixel that transforms the collected signals into visual or other analyzable forms. Near IR detector systems that operate in the 1 to 1.7 µm wavelength region are sometimes combined with visible detection systems that operate in the 400 to 700 nm wavelength range to enhance detection and visualization in low light and early night scenarios. Combined visible and near IR imaging capability is increasingly becoming a strategic requirement for both commercial and military applications. Of the many materials used for imaging systems that operate in the near infrared (e.g. HgCdTe, Ge, InSb, PtSi, etc.), InGaAs p-i-n photodiodes have been chosen due to their high performance and reliability (G. Olsen, et al., "A 128×128 InGaAs detector array for 1.0-1.7 microns," in Proceedings SPIE, Vol. 1341, 1990, pp. 432-437).

Short wavelength infrared (SWIR) imaging arrays are normally hybrid devices where the photodiodes are interconnected to silicon transistor read out integrated circuitry (ROIC). In one effort to decrease cost and simplify complex manufacturing, an InGaAs/InP photodiode has been integrated with an InP junction field effect transistor (JFET) as a switching element for each pixel, as described by U.S. Pat. No. 6,005,266, Forrest et al. (which is incorporated herein by reference in its entirety). The combination of photodiode and FET on a single substrate enabled the formation of fully monolithic near IR focal plane arrays with reduced production cost and increased performance. The InP junction field effect transistors exhibited leakage currents as low as 2pA. In related work, intentional doping of the absorption layer of a GaAs p-i-n photodiode was found to reduce the dark current as described by U.S. Pat. No. 6,573,581, Sugg. et al. (which is incorporated herein by reference in its entirety).

In previous detectors, light induced charge is collected in a single area that is then transferred to an external capacitor where the voltage on the capacitor is measured. The capacitor is then "reset" before the next measurement. Since it is difficult to completely reset a capacitor in a finite amount of time, and the collection area may be collecting charge during the reading operation itself, opportunities exist for variation in the amount of signal read.

SUMMARY

An infrared photodetector includes a first small bandgap layer of first conductivity type; a first large bandgap layer of first conductivity type overlaying the photodetector layer; a collection well of second conductivity type in the first large bandgap layer and in contact with the first small bandgap layer so that the first small bandgap layer and the collection well form an infrared photodiode; a transfer well of second conductivity type in the first large bandgap layer and spaced from the collection well and the first small bandgap layer; and a transistor that includes the collection well, the transfer well and a region between the collection well and the transfer well.

In an embodiment, an infrared photodetector includes a first small bandgap layer of a first conductivity type, a first large bandgap layer of a first conductivity type on the small bandgap layer, a second large bandgap layer of first conductivity type on the large bandgap layer, and a second small bandgap layer of a first conductivity type on the second large bandgap layer. A transfer well of a second conductivity type is located in the first small bandgap layer and first large bandgap layer. A transfer well of second conductivity type is located in the first large bandgap layer and separated from the collection well. Electrodes on the second small bandgap layer are positioned to cause charge transfer from the collection well to the transfer well.

In a further embodiment, a method of forming an infrared photodetector includes depositing a first large bandgap layer of a first conductivity type on a small bandgap layer of a first conductivity type and depositing a second large bandgap layer of a first conductivity type on the first large bandgap layer. A collection well of a second conductivity type is formed by diffusion in the first small bandgap layer, first large bandgap layer, and second large bandgap layer. A transfer well of a second conductivity type is formed by diffusion in the first and second large bandgap layers and is spaced from the collection well and the first small bandgap layer. Electrodes on the small bandgap layer are positioned to allow charge transfer from the collection well to the transfer well.

BRIEF DESCRIPTION OF THE DRAWINGS

FIG. 5-8B show alternate versions of the photodetector/transistor device.

DETAILED DESCRIPTION

Figure 1:
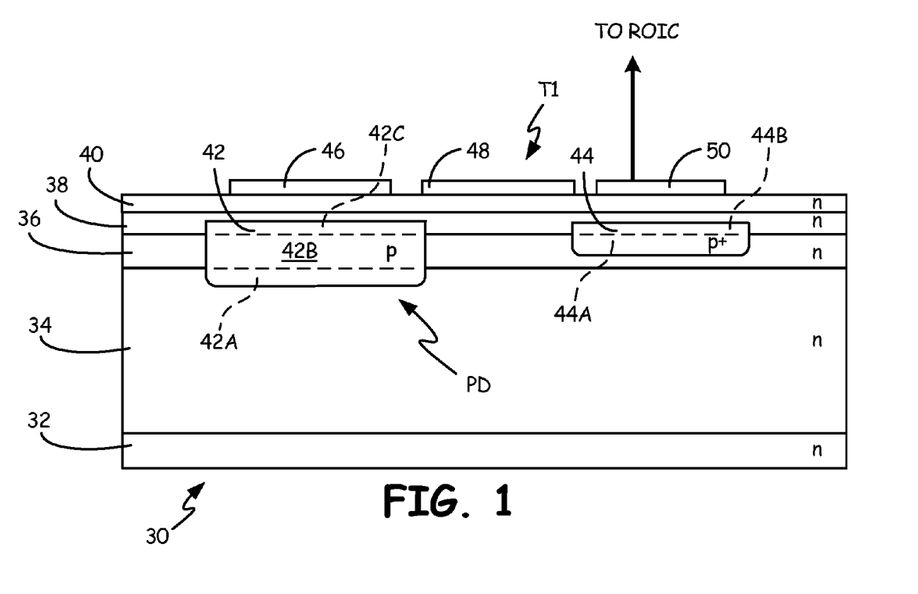
FIG. 1 is a schematic illustration of a photodetector/transistor device architecture of the invention.

FIG. 1 shows device 30, which includes an integrated photodetector PD and low noise, epitaxial, multi-layer field effect transistor T1. This device architecture uses one area for charge collection and a separate area for charge measurement. In addition, a capacitor is not needed for measurement of signal level.

Although photodetector device 30 will be described based on InGaAs/InAlAs/InP material and device technology, the methods and features discussed herein are not intended to be limited to that material system alone, and other III-V and II-VI compound semiconductor materials are included in the scope of the invention.

Device 30 is a multilayer structure including n type large bandgap base or substrate layer 32, n type small bandgap photosensor layer 34, n type very large bandgap layer 36, n type large bandgap layer 38, n type small bandgap passivation layer 40, p type collection well 42, p+ type transfer well 44, source contact 46, gate transfer contact 48, and drain contact 50. N type layer 34 and collection well 42 form a short wavelength infrared (SWIR) photodiode PD. Layers 38 and 40, collection well 42, transfer well 44, source electrode 46, gate transfer electrode 48 and drain electrode 50 form lateral junction field effect transistor (JFET) T1.

In one embodiment, n type large bandgap baselayer 32 is InP with a thickness of about 0.05 µm, doping concentration of about $1.0e^{18}$ and bandgap of about 1.344 ev. N type small bandgap layer 34 is InGaAs with a thickness of about 2.7 µm, doping concentration of about $1.0e^{15}$ to $1.0e^{17}$ and bandgap of about 0.74 ev. N type large bandgap layer 36 is $In_xAl_{1-x}As$ with a thickness of about 0.4 μm, doping concentration of about $1.0e^{16}$ and bandgap of about 1.46 ev. N type large bandgap layer 38 is InP with a thickness of about 0.1 μm, doping concentration of about $1.0e^{17}$ and bandgap of about 1.344 ev. N type small bandgap passivation layer 40 is $In_xGa_{1-x}As$ with a thickness of about 0.05 μm, doping concentration of $1.0e^{17}$ and bandgap of about 0.740 ev.

In this embodiment, P type collection well 42 is formed by diffusion into layers 34, 36, and 38. As a result, collection well 42 has a three layer structure comprising layers 42A, 42B, and 42C. Layer 42A of collection well 42 is $In_xGa_{1-x}As$ with a thickness of about 0.1 μm, doping concentration of about $1.0e^{16}$ and bandgap of about 0.74 ev. Layer 42B of collection well 42 is $In_xAl_{1-x}As$ with a thickness of about 0.4 μm, doping concentration of about $1.0e^{16}$ and bandgap of about 1.46 ev. Layer 42C of collection well 42 is InP with a thickness of about 0.05 to 0 μm, doping concentration of about $1.0e^{16}$ and bandgap of about 1.344 ev. Transfer well 44 is formed by diffusion into layers 36 and 38. As a result, transfer well 44 has a two-layer structure comprising layers 44A and 44B. Layer 44A of transfer well 44 may be $In_xAl_{1-x}As$ with a thickness of about 0.2 μm, doping concentration of about $1.0e^{17}$ and bandgap of about 1.46 ev. Layer 44B of transfer well 44 is InP with a thickness of about 0.05 to 0 μm, doping concentration of about $1.0e^{17}$ and bandgap of about 1.344 ev.

Source electrode 46, gate transfer electrode 48, and drain electrode 50 may be Au, Cu, Ag, Pd, Pt, Ni and others known in the art.

Figure 2A:
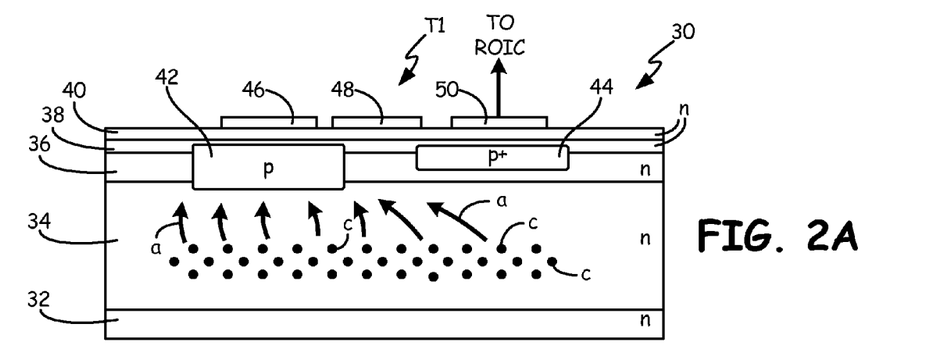
FIGS. 2A-2C are illustrations showing the operation of the photodetector of the invention.
Figure 2B:
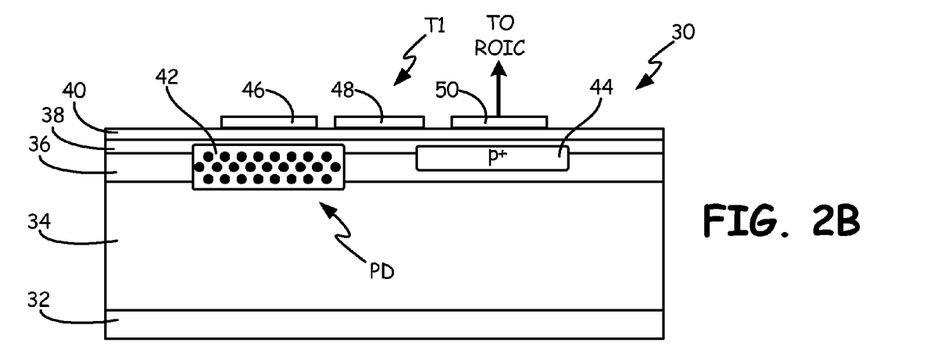
Figure 2C:
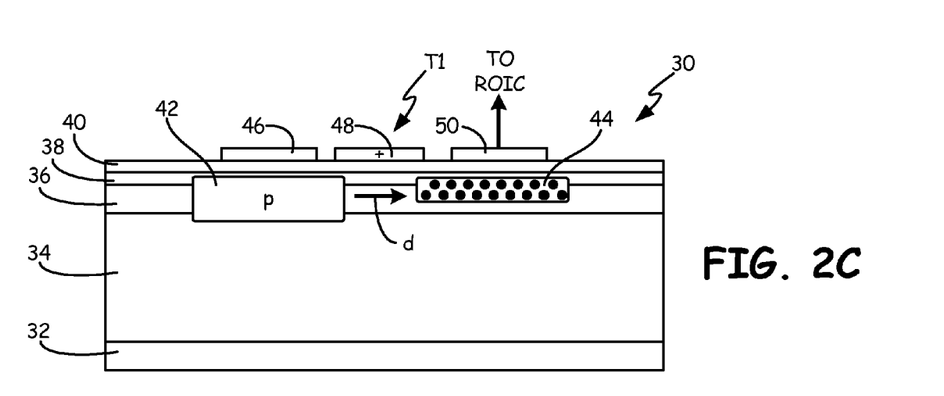

Schematic figures illustrating the operation of device 30 are shown in FIGS. 2A-2C. The device operates by collecting photoinduced carriers in P type collection well 42 of photodiode T1. The collected charge is transferred by transistor T1 from collection well 42 (which acts as the source of T1) to transfer well 44 (which acts as the drain of T1). The charge in transfer well 44 can then be read out without affecting generation and collection of carriers by photodiode PD.

In FIG. 2A, SWIR radiation is absorbed in high sensitivity photodetector layer 34 and produces photo-induced carriers. In FIG. 2B, the carriers are driven toward collection well 42 as indicated by arrows a., and are swept across the pn junction formed by n type photodetection layer 34 and collection well 42. As shown in FIG. 2C the carriers, in well 42 are then transferred to transfer well 44 as schematically shown by arrow d. A positive voltage on transfer gate electrode 48 inverts underlying very large bandgap layer 36 to p type between collection well 42 and transfer well 44. This allows charges c in collection well 42 to move to transfer well 44. The charges in transfer well 44 may then be sampled by an external ROIC circuit. There is complete charge transfer and no reset noise is generated during the transfer.

Figure 3:
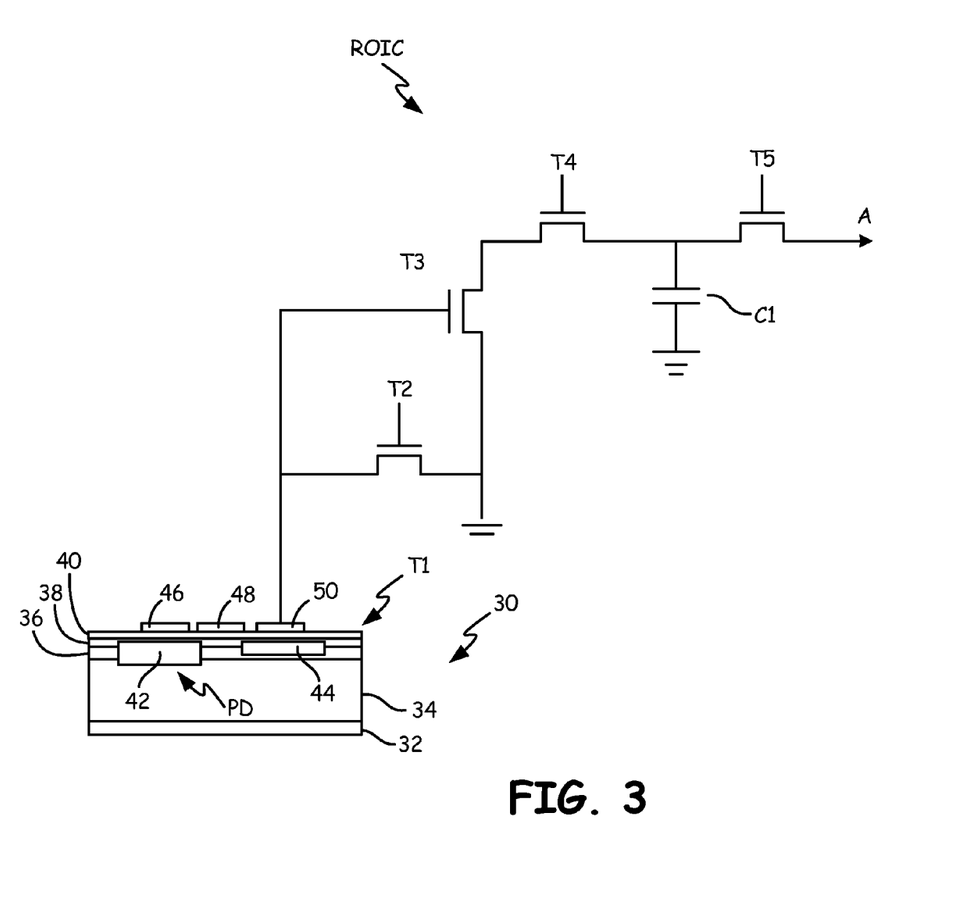
FIG. 3 is a schematic illustration of the photodetector and related read out integrated circuitry (ROIC) of the invention.

FIG. 3 shows device 30 with a portion of the ROIC circuitry. Transistor T1 of device 30 forms one transistor of a five transistor (5T) architecture used by the ROIC to acquire the photosignal generated by photodiode PD of device 30 for measurement. In a SWIR array, there will be an array of devices 30, together with associated 5T circuits. The photosignals are delivered by the 5T circuits to measurement and further signal processing circuitry (not shown).

The 5T circuit in FIG. 3 includes field effect transistors T1-T5 and optional capacitor C1. Transistor T2 is a reset transistor that is turned on to reset device 30 for the next charge transfer and readout cycle by connecting transfer well 44 to ground. This resets transfer well 44 before the next transfer of carriers from collection 42.

Transistor T3 has its gate connected to drain contact 50 of device 30. Transistor T3 acts as a source follower, with its source voltage being a function of the charge in transfer well 44.

Transistors T4 and T5 are sample select and column select switches, respectively, that select the photosignal being delivered to the photosignal being delivered to the further ROIC circuitry. Capacitor C1 is used if it is desired to perform sample and column selects sequentially rather than simultaneously. In that case, voltage at the source of T3 is stored in capacitor C1 and then read out by turning on column select transistor T5.

Figure 4A:
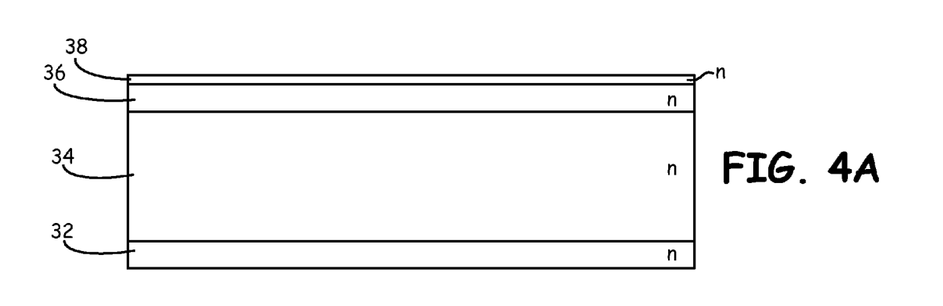
FIGS. 4A-4J are schematic illustrations of the formation steps of the invention.

A method of forming device 30 is shown in FIGS. 4A-4J. The starting material shown in FIG. 4A is a multilayer heterostructure made up of layers 32, 34, 36, 38 and 40. As an example, layers 32 and 38 may be InP; layer 34 may be $In_xGa_{1-x}As$; and layer 36 may be $In_xAl_yGa_{(1-(x+y))}As$. The compositions, thickness, and doping levels of one specific embodiment have already been described. The heterostructure may be formed by any epitaxial growth process known in the art. Examples include organometallic vapor phase epitaxy (OMVPE), metal organic chemical vapor deposition (MOCVD), molecular beam epitaxy (MBE), and others known in the art. A preferred technique is MOCVD.

Figure 4B:
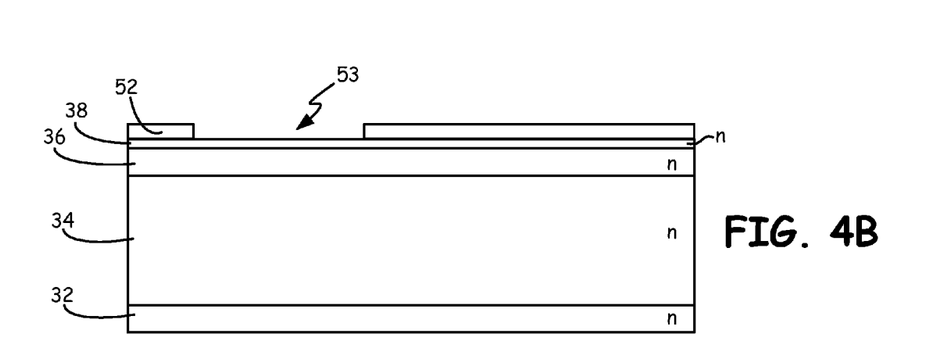

In the next step, as shown in FIG. 4B, diffusion barrier layer 52 is deposited on top layer 38 with window 53 to allow doping material to be deposited over a portion of layer 38 through doping window 53. Diffusion barrier layer 52 may be a nitride, photoresist, or other barrier materials known in the art.

Figure 4C:
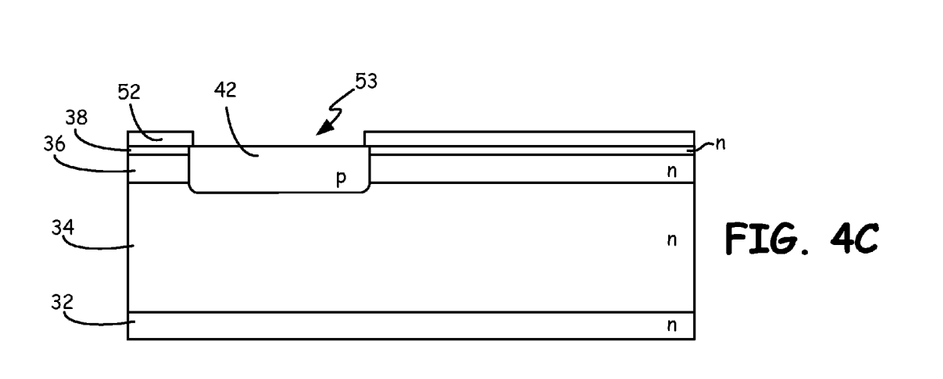

As shown in FIG. 4C. a first diffusion then allows dopant to form p type collection well 42. The depth of diffused p type well 42 intentionally extends through layer 36 such that it is in contact with small bandgap photodetector layer 34.

Figure 4D:
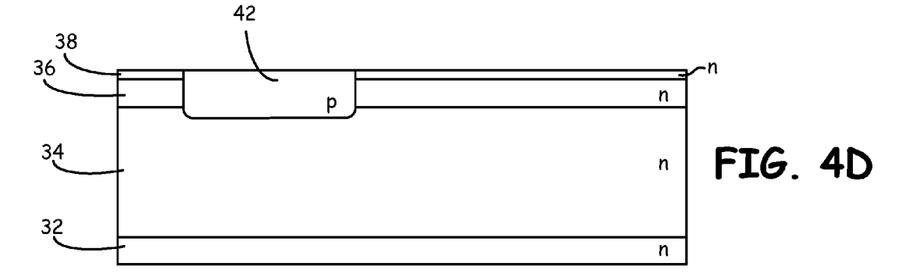
Figure 4E:
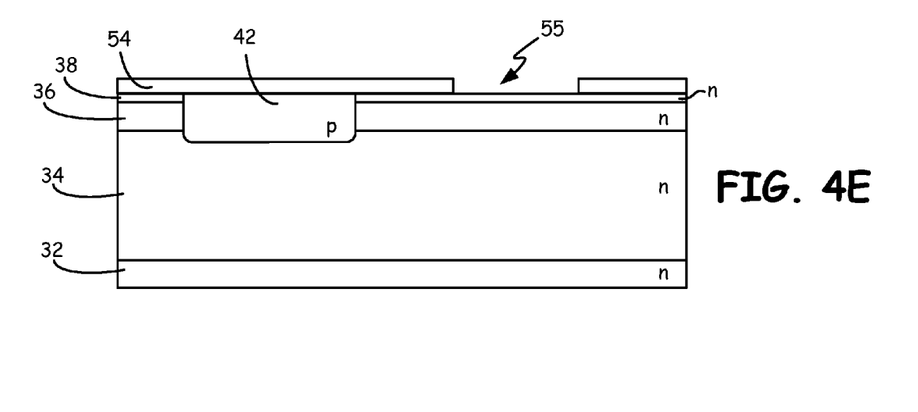
Figure 4F:
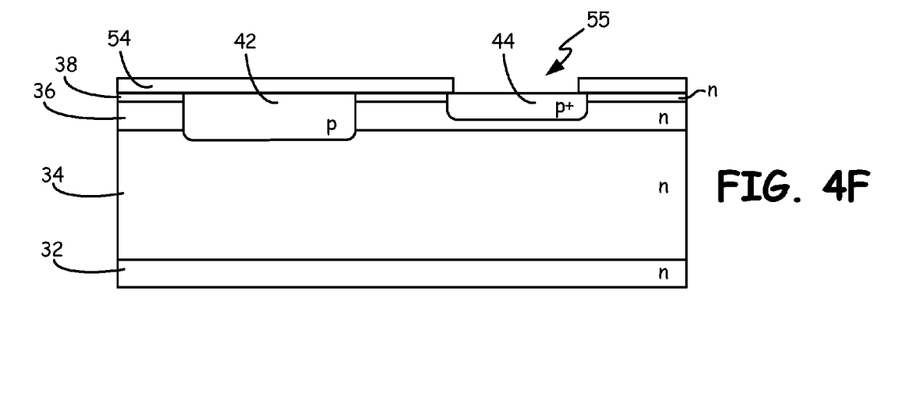

Diffusion barrier layer 52 is then removed as shown in FIG. 4D and second diffusion barrier layer 54 with window 55 is deposited on large bandgap layer 38, as shown in FIG. 4E. A second diffusion then allows dopant to form p+ type transfer well 44 as shown in FIG. 4F.

Figure 4G:
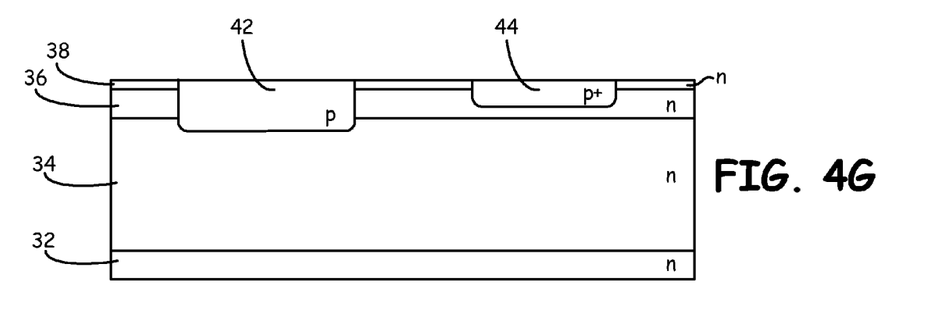

In the next step shown in FIG. 4G, diffusion barrier layer 54 is removed, and the surface prepared for the next layer deposition process.

Figure 4H:
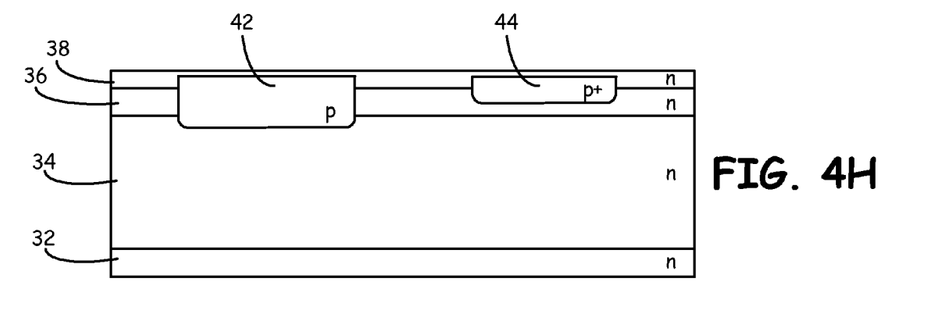
Figure 4I:
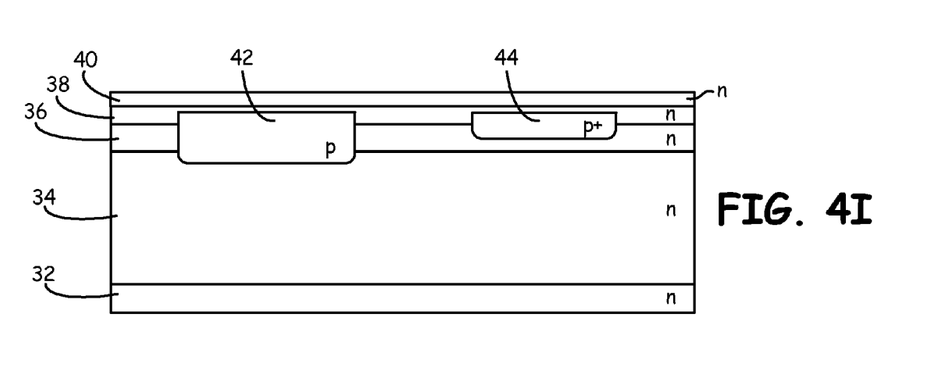

As shown in FIG. 4H, charge well 42 and collection well 44 are overgrown by additional InP to bury both wells in InP material of layer 38. N type small bandgap passivation layer 40 is then deposited on layer 38 as shown in FIG. 4I.

Figure 4J:
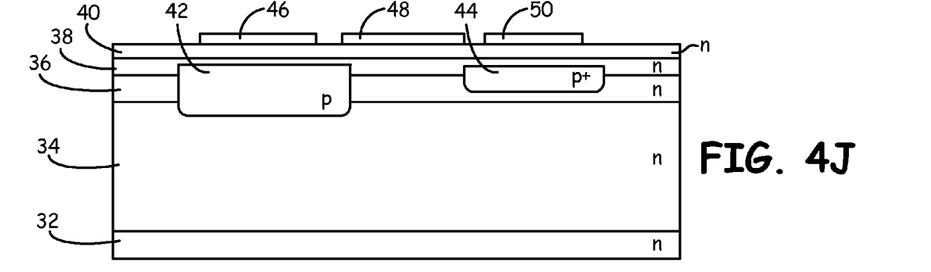
Figure 5:
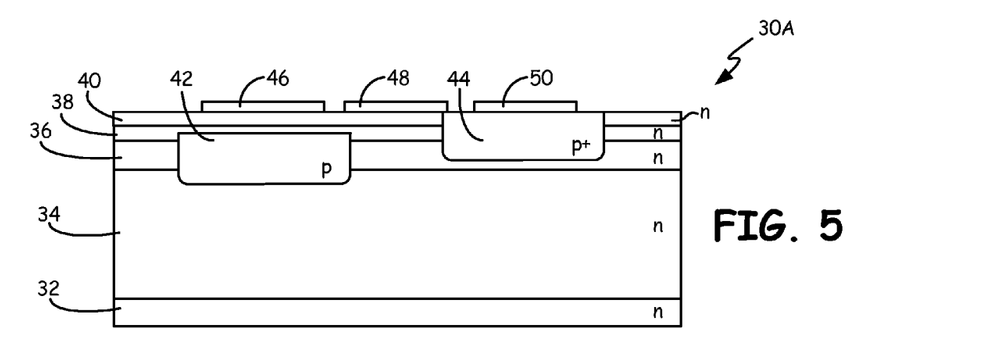

In the final step, as shown in FIG. 4J, contact regions are defined by photolithography and source contact 46, gate transfer contact 48, and drain contact 50 are deposited on small bandgap passivation layer 40. Contacts 46, 48, and 50 are deposited by photolithography, sputtering, electroplating or other means of deposition known in the art. Preferred contact materials are Au, Cu, Ag, Pd, Pt, Ni and others known in the art.

Alternate versions 30A-30D of the photodetector/transistor device are illustrated in FIGS. 5-8B. In device 30A of FIG. 5, transfer well 44 extends from the top surface of layer 40 through layer 38 into layer 36. Drain contact 50 directly contacts transfer well 44. This configuration of the transfer well can be emptied immediately after the charge is read.

Figure 6:
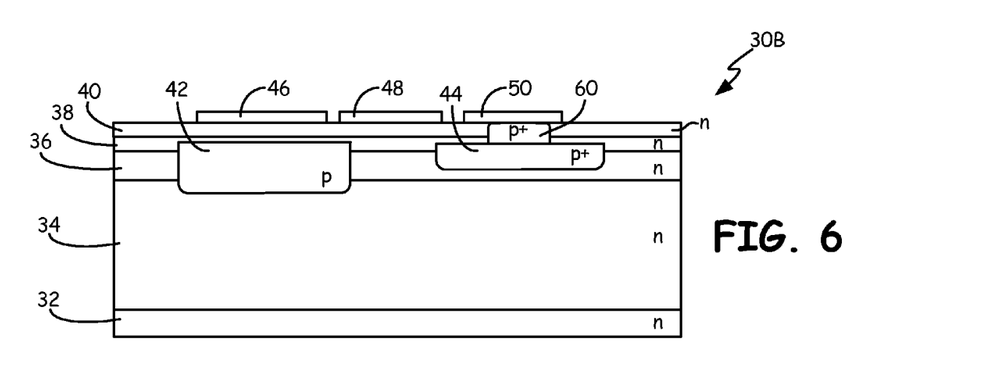

In FIG. 6, device 30B includes p+ diffusion region 60 that connects transfer well 44 to the top surface of layer 40. Region 60 connects drain contact 50 to transfer well 44. The benefit of this configuration is that the transfer well can be emptied immediately after the charge is read.

Figure 7:
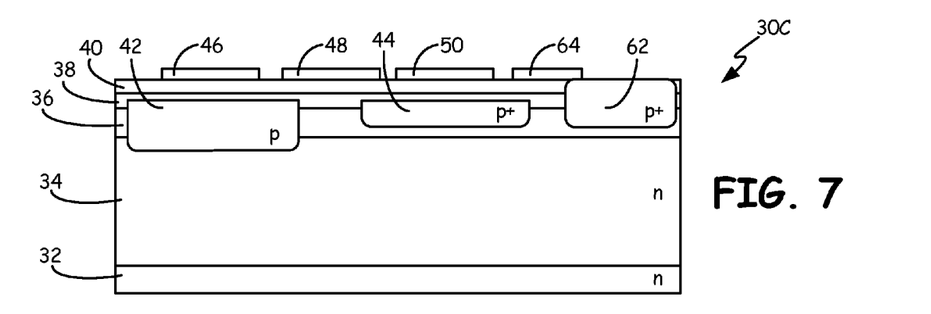

Device 30C is schematically shown in FIG. 7. Device 30C includes p+ dumping well 62 and second transfer gate electrode 64. After the charge in transfer well 44 is read, the charge can be transferred ("dumped") into "dumping well" 62 to empty transfer well 44. This, in effect, adds a second transistor to the device.

Figure 8A:
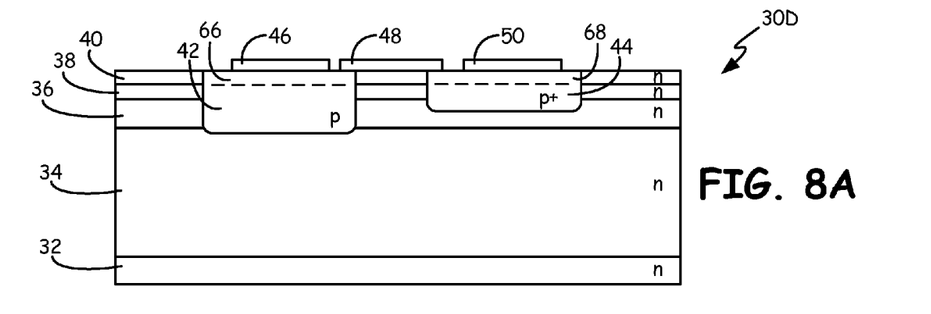
Figure 8B:
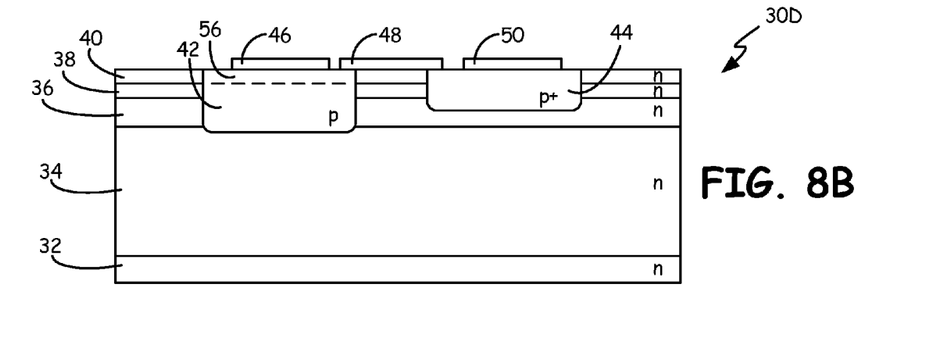

Device 30D is schematically shown in FIGS. 8A and 8B. In device 30D both p type collection well 42 and p+ type transfer well 44 extend to the top surface of layer 40. Source contact 46 and drain contact 50 directly contact p type collection well 42 and p+ type transfer well 44, respectfully, and form Schottky barrier diode contacts. Applying a reverse bias to contacts 46 and 50 may create depletion regions under the contacts transforming regions 66 and 68 into n type surface regions effectively burying p collection well 42 and p+ transfer well 44 under carrier migration barrier layers resulting in decreased (or eliminated) surface noise.

After charges have been collected in transfer well 44, the bias voltage on contact 50 that created carrier migration barrier layer 68, as shown in FIG. 8A, can be changed to remove the Schottky barrier. As schematically shown in FIG. 8B carriers in transfer well 44 may then be extracted through drain 50. In another embodiment, collection well 42 may remain buried under carrier migration barrier layers 38 and 40 as in FIG. 4J while transfer well 44 may be extended to the surface as in FIG. 5. In this case, drain contact 50 and transfer well 44 may form a Schottky barrier biased to create a carrier migration barrier as in FIG. 8A until carriers in transfer well 44 need to be extgracted.

The photodetector/transistor structure shown in FIGS. 1 and 5-8B offer certain design features and benefits. They include:

Charge well 42 may be a buried p type diffusion layer surrounded by a detailed bandgap engineered material on all sides except through the charge collection region. This allows charge to be collected while keeping collected dark current low and separating the collection area from the surface of the InGaAs material. This buried layer minimizes both surface recombination and shunt contribution to noise.

Charge well 42 and transfer well 44 may form a double diffusion/regrowth structure. They comprise two p type regions with different depth and dopant concentrations. This combination enables both a complete charge transfer and an isolation of the transfer region from the photocurrent generation region. This is key for ultra-low read noise performance.

In place of FET 30, a p-n-p transistor can be used to transfer the charge from the collection well to the transfer well.

All these features, plus a mechanism for dumping the charge from transfer well 44 may be included in 5-8 micrometer pixels.

By avoiding the capacitor reset noise of the prior art, the inherent noise of the pixel may be orders of magnitudes lower than prior art devices.

The architecture of the present invention may achieve five times (5×) greater sensitivity enabling night imaging at below starlight levels while reducing pixel pitch by three times (3×). As a result, the detectors may operate at lower light conditions; operate at higher operating temperature for a given light level; operate at lower power since, for example, cooling is not needed to improve performance; and allow higher resolution in a smaller detector with smaller optics and a higher areal density of chips on a wafer, resulting in reduced cost.

Discussion of Possible Embodiments

The following are nonexclusive descriptions of possible embodiments of the present invention.

An infrared photodetector includes a first small bandgap layer of first conductivity type; a first large bandgap layer of first conductivity type overlaying the photodetector layer; a collection well of second conductivity type in the first large bandgap layer and in contact with the first small bandgap layer so that the first small bandgap layer and the collection well form an infrared photodiode; a transfer well of second conductivity type in the first large bandgap layer and spaced from the collection well and the first small bandgap layer; and a transistor that includes the collection well, the transfer well and a region between the collection well and the transfer well.

The photodetector of the preceding paragraph can optionally include, additionally and/or alternatively any one or more of the following features, configurations, and/or components:

The transistor may include a first electrode coupled to the collection well, a second electrode coupled to the transfer well, and a third electrode coupled to the region between the collection well and the transfer well.

The first, second and third electrodes may be Ti, Pt, Au, Ni, Cu, or combinations thereof.

The second large bandgap layer of first conductivity type may overlay the first large bandgap layer.

The collection well may be a buried structure connected to the first small bandgap layer on one side and otherwise surrounded by first and second large bandgap layers.

The transfer well may be buried structure within the first and second large bandgap layers.

A second small bandgap layer of first conductivity type may overlay the second large bandgap layer.

The transfer well may extend to a top surface of the second small bandgap layer.

The collection well may extend to a top surface of the second small bandgap layer.

A dumping well of second conductivity type may be in the first large bandgap layer and spaced from the small bandgap layer and the transfer well.

An infrared photodetector may include a first small bandgap layer of a first conductivity type; a first large bandgap layer of a first conductivity type may be on the first bandgap layer; a second large bandgap layer of a first conductivity type may be on the first large bandgap layer; a second small bandgap layer may be on the second large bandgap layer; a collection well of a second conductivity type may be located in the first small bandgap layer and first large bandgap layer; a transfer well of a second conductivity type may be located in the first large bandgap layer; and electrodes on the second small band gap layer may be positioned to cause transfer of charge from the collection well to the transfer well.

The photodetector of the preceding paragraph can optionally include, additionally and/or alternatively any one or more of the following features, configurations, and/or components:

The collection well may be a buried structure that extends into the first small bandgap layer and is otherwise surrounded by the first and second large bandgap layers.

The transfer well may be a buried structure in the first and second large bandgap layers.

The collection well may extend to a top surface of the second small bandgap layer.

The transfer well may extend to a top surface of the second small bandgap layer.

A dumping well of a second conductivity type may be in the first large bandgap layer and spaced from the first small bandgap layer and the transfer well.

A method of forming an infrared photodetector may include: depositing a first small bandgap layer of first conductivity type; depositing a first large bandgap layer of first conductivity type on the first small bandgap layer of first conductivity type; depositing a second large bandgap layer of first conductivity type on the first large bandgap layer; forming by diffusion a collection well of second conductivity type located in the first small bandgap layer, the first large bandgap layer, and the second large bandgap layer; and forming by diffusion a transfer well of second conductivity type located in the first and second large bandgap layer and spaced from the collection well and the first small bandgap layer.

The method of the preceding paragraph can optionally include, additionally and/or alternatively any, one or more of the following features, configurations, and/or additional components:

The second large bandgap layer may be deposited so that the collection well and the transfer well are buried.

A second small bandgap layer may be deposited over the second large bandgap layer.

Electrodes may be formed on a top surface of the second small bandgap layer that overly the collection well, the transfer well, and a region between the collection well and the transfer well.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An infrared photodetector comprising:
    a first small bandgap layer of first conductivity type;
    a first large bandgap layer of first conductivity type overlying the first small bandgap layer of first conductivity type;
    a collection well of second conductivity type in the first large bandgap layer and in contact with the first small bandgap layer so that the first small bandgap layer and the collection well form an infrared photodiode;
    a transfer well of second conductivity type in the first large bandgap layer and spaced from the collection well and the first small bandgap layer; and
    a transistor that includes the collection well, the transfer well and a region between the collection well and the transfer well.

2. The structure of claim 1, wherein the transistor further includes:
    a first electrode coupled to the collection well;
    a second electrode coupled to the transfer well; and
    a third electrode coupled to the region between the collection well and the transfer well.

3. The infrared photodetector of claim 2, wherein the first, second, and third electrodes comprise Ti, Pt, Au, Ni, Cu, or combinations thereof.

4. The infrared photodetector of claim 1, and further comprising a second large bandgap layer of first conductivity type overlying the first large bandgap layer.

5. The infrared photodetector of claim 4, wherein the collection well is a buried structure connected to the first small bandgap layer on one side, otherwise surrounded by first and second large bandgap layers.

6. The infrared photodetector of claim 4, wherein the transfer well is a buried structure within the first and second large bandgap layers.

7. The infrared photodetector of claim 4 and further comprising a second small bandgap layer of first conductivity type overlying the second large bandgap layer.

8. The infrared photodetector of claim 7 wherein the transfer well extends to a top surface of the second small bandgap layer.

9. The infrared photodetector of claim 7 wherein the collection well extends to a top surface of the second small bandgap layer.

10. The infrared photodetector of claim 1 and further comprising: a dumping well of second conductivity type in the first large bandgap layer and spaced from the small bandgap layer and the transfer well.

11. An infrared photodetector comprising:
    a first small bandgap layer of first conductivity type;
    a first large bandgap layer of first conductivity type on the first small bandgap layer of first conductivity type;
    a second large bandgap layer of first conductivity type on the first large bandgap layer;
    a second small bandgap layer on the second large bandgap layer;
    a collection well of second conductivity type located in the first small bandgap layer and first large bandgap layer;
    a transfer well of second conductivity type located in the first large bandgap layer; and
    electrodes on the second small bandgap layer positioned to cause transfer of charge from the collection well to the transfer well.

12. The infrared photodetector of claim 11, wherein the collection well is a buried structure that extends into the first small bandgap layer and is otherwise surrounded by the first and second large bandgap layers.

13. The infrared photodetector of claim 11, wherein the transfer well is a buried structure in the first and second large bandgap layers.

14. The infrared photodetector of claim 11, wherein the collection well extends to a top surface of the second small bandgap layer.

15. The infrared photodetector of claim 11, wherein the transfer well extends to a top surface of the second small bandgap layer.

16. The infrared photodetector of claim 11 and further comprising:
    a dumping well of second conductivity type in the first large bandgap layer and spaced from the first small bandgap layer and the transfer well.

* * * * *